United States Patent [19]

Wallestad

[11] 3,926,305

[45] Dec. 16, 1975

[54] WAFER BASKET

[75] Inventor: Victor C. Wallestad, Chaska, Minn.

[73] Assignee: Fluoroware, Inc., Chaska, Minn.

[22] Filed: July 12, 1973

[21] Appl. No.: 378,686

[52] U.S. Cl. .................. 206/73; 206/334; 206/454; 211/41; 224/45 P; 294/33; 53/390

[51] Int. Cl.[2] ...................... B65D 1/34; B65D 85/30

[58] Field of Search ........... 206/332, 328, 445, 455, 206/456, 454, 449; 211/41, 40, 126; 294/27 R; 224/45 P, 45 R, 48 A; 53/247, 390

[56] References Cited

UNITED STATES PATENTS

| | | | |
|---|---|---|---|
| 912,472 | 2/1909 | Hart | 224/45 P |
| 1,764,754 | 6/1930 | Scott | 211/40 |
| 2,019,722 | 11/1935 | Neumeyer | 224/48 A |
| 2,612,401 | 9/1952 | Simmonds | 294/27 R |
| 2,729,375 | 1/1956 | Pace | 53/247 |
| 3,365,070 | 1/1968 | Miles | 211/126 |
| 3,487,948 | 1/1970 | Haidegger | 211/41 |
| 3,534,862 | 10/1970 | Shambelan | 206/332 |
| 3,701,558 | 10/1972 | Baker | 294/33 |
| 3,850,296 | 11/1974 | Hirata et al. | 206/73 |

*Primary Examiner*—William T. Dixson, Jr.
*Attorney, Agent, or Firm*—James R. Haller; H. Dale Palmatier

[57] ABSTRACT

A wafer basket having parallel side walls between which may be held axially aligned wafers includes end supports configured to permit end-wise access to wafers axially from one end thereof and edge-wise from the other end thereof. Also disclosed is a handle adapted to grasp the end supports for carrying the basket.

10 Claims, 8 Drawing Figures

WAFER BASKET

DESCRIPTION OF THE INVENTION

The present invention relates to industrial receptacles and more particularly relates to baskets for storing and transporting wafers such as silicon wafers employed in semiconductor technology.

Silicon wafers useful in semiconductor technology may be provided with variously configured metal conductors on their surfaces. In one process, wafers are coated with a photosensitive resist composition, exposed to light through a mask to harden the resist composition in light-struck areas, treated to remove unhardened resist composition, and exposed to vaporized metal which adheres to the wafer surface in areas freed of resist composition. Because of the miniaturization required by present day technology, wafers must be maintained scrupulously clean and must be handled with utmost care. Wafers may be processed, and carried from one processing step to the next, in "wafer baskets." Such baskets may be capable of carrying many wafers carefully spaced from each other, and the baskets themselves may be subjected during processing to high temperatures and to corrosive chemicals. Certain processing machines remove wafers from a basket by making axial contact with the wafers through an open end of the basket. Other machines remove wafers by contacting exposed edges thereof. Different processing machines, which may employ baskets of varying configurations, often require wafers to be transferred from one basket type to another. Such transfers are wasteful of time and are potential sources of contamination and breakage.

BRIEF SUMMARY OF THE INVENTION

The present invention relates to a wafer basket having opposed side walls adapted to carry axially aligned wafers therebetween, an open top through which wafers may be inserted and ejected, an open bottom, and end supports joining the side walls at their respective ends. One end support joins its respective side wall ends solely adjacent the bottom edges thereof to allow end-wise access to wafers axially of the wafers. The other end support joins its respective side wall ends substantially midway their heights.

BRIEF DESCRIPTION OF THE DRAWING

Referring now to FIGS. 1–4, a wafer basket designated generally as 10 has side walls 12 and 14 which are substantially parallel. The inner surfaces of the walls are respectively provided with matching, vertical grooves 16 therein which are accessible through the open top of the basket, and which extend vertically downward to terminate at points spaced from the bottom edge 18 of the inner wall surfaces. The grooves 16 are preferably tapered inwardly toward their apices, and the grooves of one wall 12 are respectively aligned with the grooves of the other wall 14 so that wafers, e.g., thin, circular disks, may be inserted in axial alignment with one another between the walls 12 and 14. The wafers ordinarily have sharp edges which bear against the inwardly tapered walls of the grooves 16 so as to provide very small areas of contact between the wafers and the grooves. The bottom edges 18 of the walls 12 and 14 may have legs 20 depending therefrom so that when the basket is set on the legs, wafers contained therein (22 in FIG. 4) may be suitably spaced from the surface upon which the basket rests. The bottom of the basket is open to permit processing chemicals, heated air currents, and the like to contact the wafers through the bottom of the basket as well as through the top.

Figure 1:
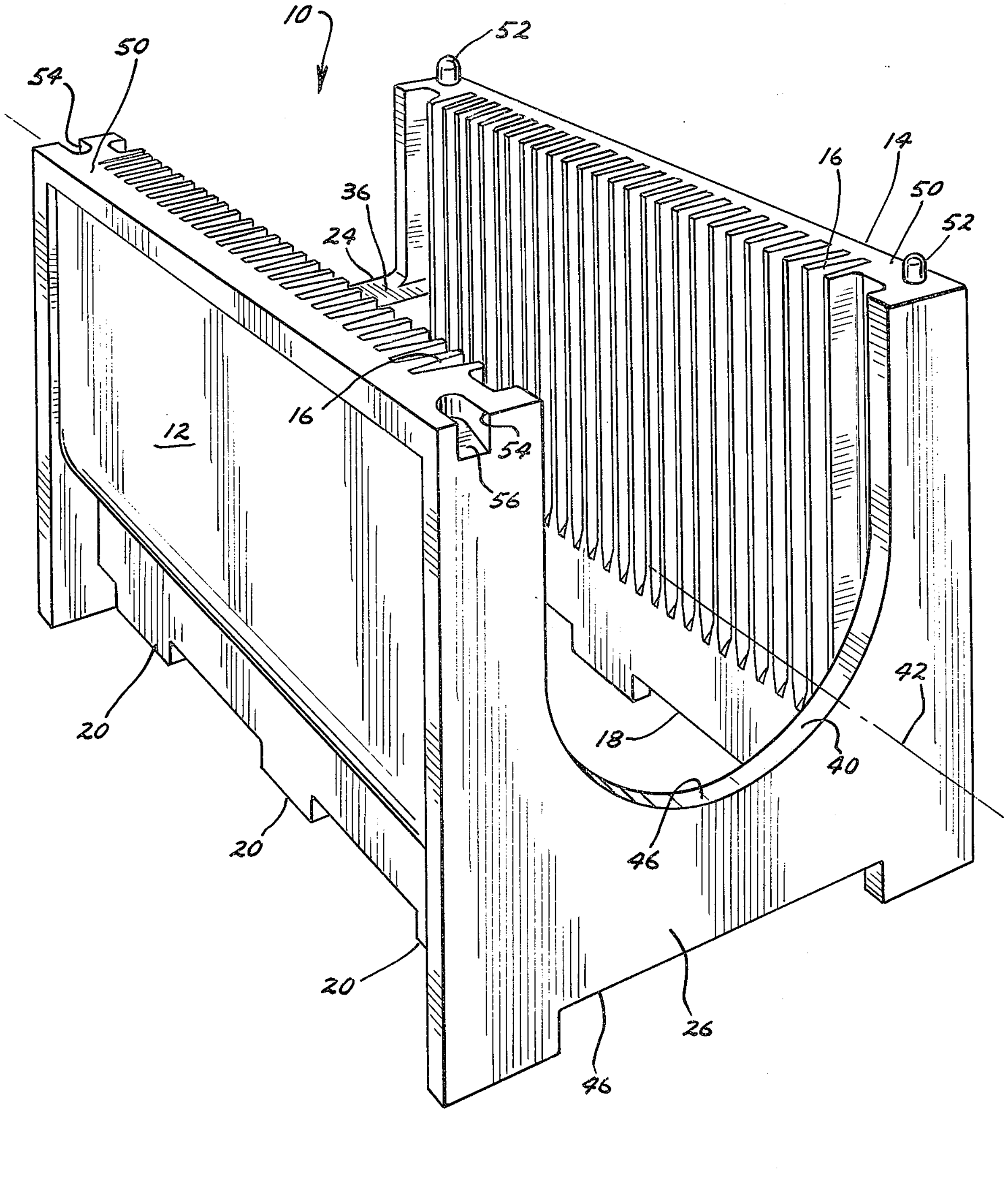
FIG. 1 is a perspective view of a wafer basket of the invention.

The side walls 12 and 14 are supported in spaced configuration at their respective ends by end supports 24 and 26. End support 24, which may be in the form of a horizontal bar of rectangular cross section, joins walls 12 and 14 substantially equidistant their heights, as shown best in FIGS. 3 and 4, permitting end-wise access to wafers. The bottom surface 32 of the end support 24 is provided centrally with an upwardly and inwardly tapered surface section 34 and a substantially horizontal upper surface 36. The surfaces 32, 34 and 36 of end support 24 are adapted for engagement with inwardly extending grasping projections on the end of a unitary handle, and to center the handle on the end support 24, all of which will be more fully described below.

End support 26 is joined to the respective ends of side walls 12 and 14 solely adjacent the bottoms thereof; that is, this end support is positioned at or near the bottom of the basket so that end-wise access to wafers contained therein is afforded along the mutual axis 42 thereof. The upper surface 40 of the end support 26 thus defines a recess between the walls 12 and 14 which is fully open from above. In one processing machine, an arm is caused to enter the basket axially of one end thereof above end support 26 to centrally contact a wafer therein and to remove the same from the basket through the open top thereof. The basket may be tipped on one end for this operation. Because of the position of end support 26 near the bottom of the side walls 12 and 14, the arm of the machine may move into the basket axially of the wafers therein to contact a wafer, and may then convey the wafer outwardly through the open top of the basket, the direction of the arm during this operation being shown generally by the arrow 44 in FIG. 3.

Figures 2, 3, 4:
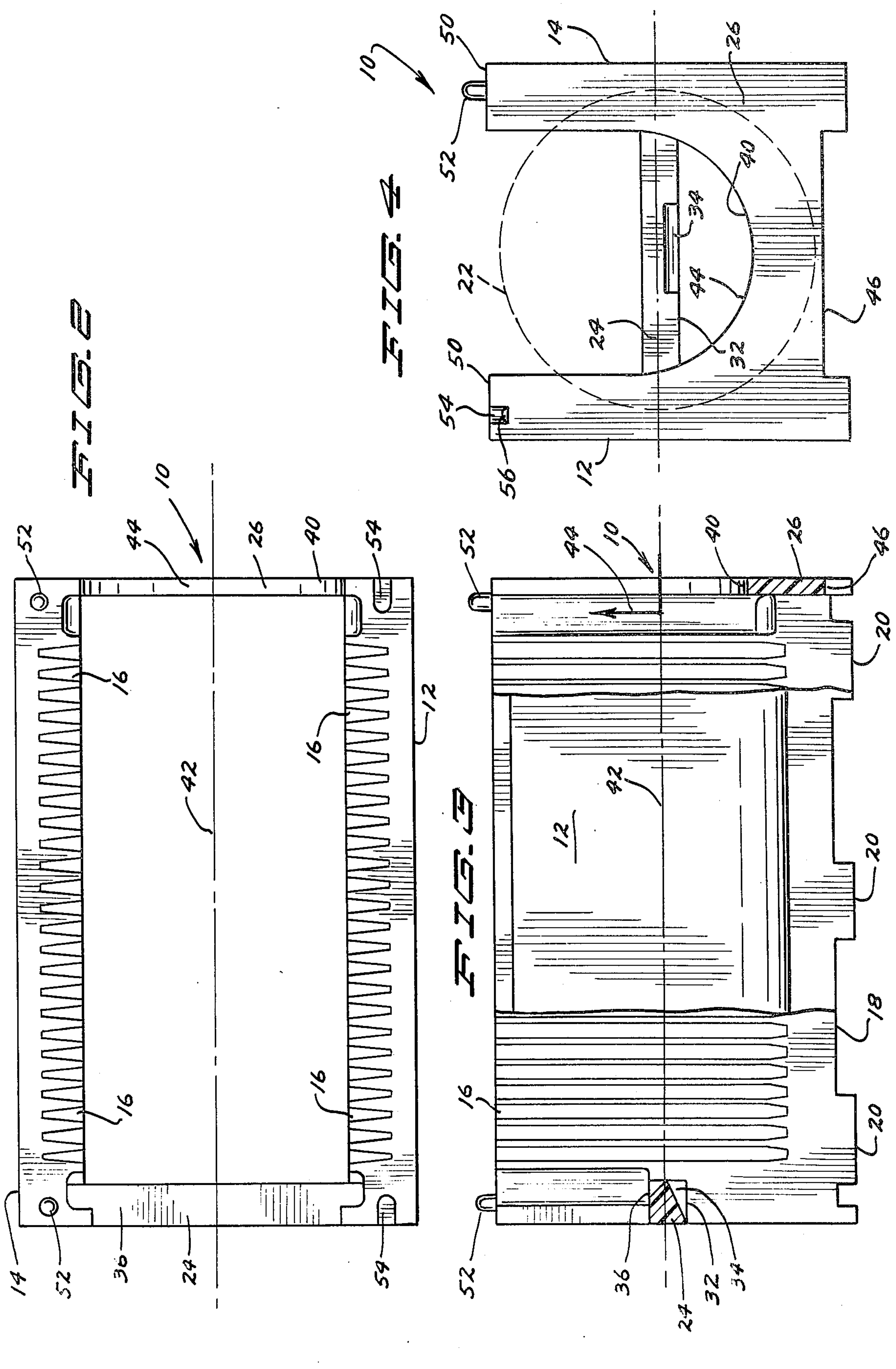
FIG. 2 is a plan view of the wafer basket of FIG. 1.
FIG. 3 is a side elevational view of the wafer basket of FIG. 2, shown in partial cross section.
FIG. 4 is an end elevational view of the wafer basket of FIG. 2, with a wafer therein shown in dashed lines.
Figures 5, 6, 7, 8:
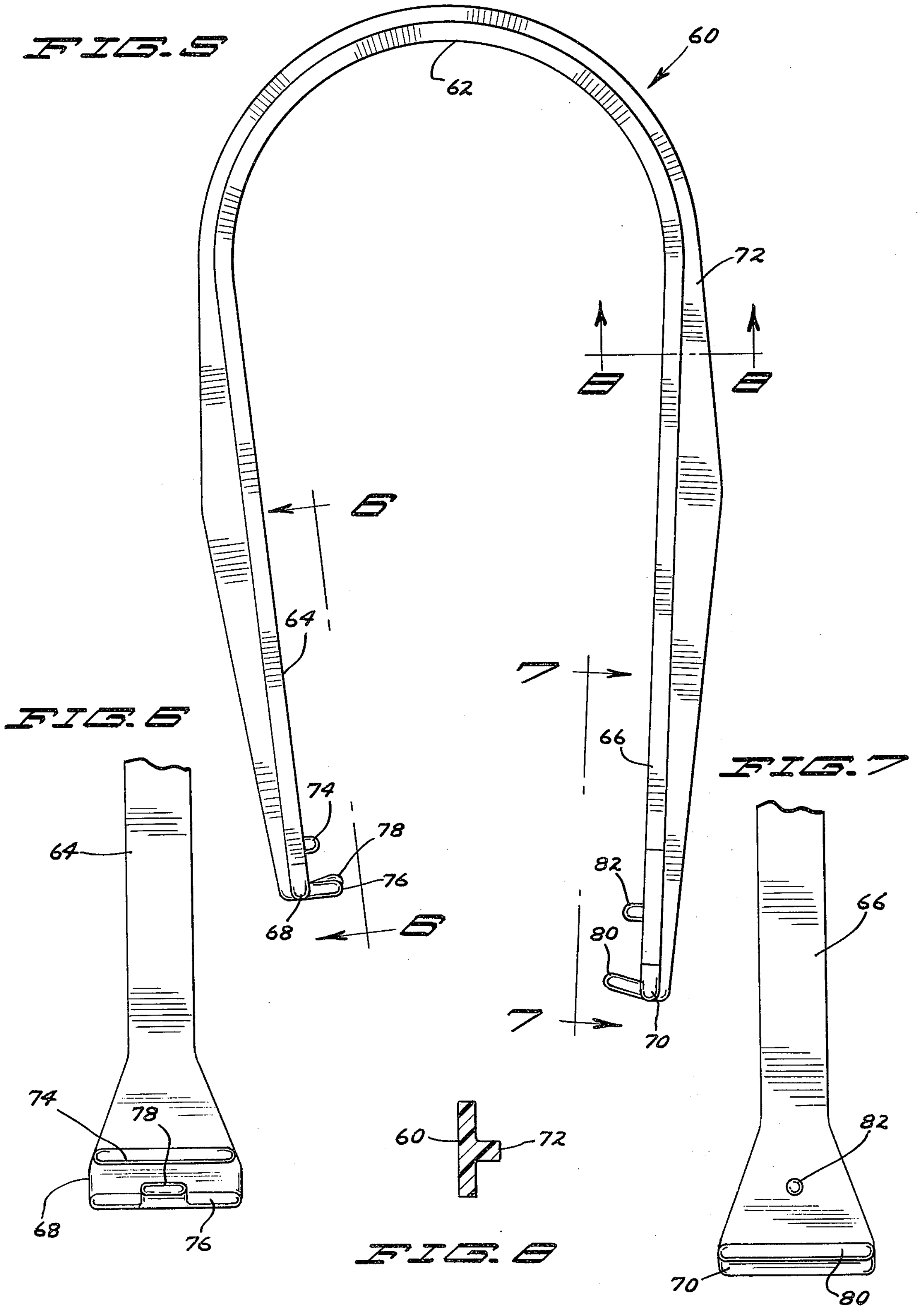
FIG. 5 is a side view of a handle for carrying the wafer basket of the invention.
FIGS. 6 and 7 are broken away views of the ends of the handle of FIG. 5, taken along lines 6—6 and 7—7 of FIG. 5, respectively.
FIG. 8 is a cross-sectional view taken along line 8—8 of FIG. 5.

The top surface 40 of the end support 26 preferably is concave upwards, as shown in FIGS. 1 and 4, and has its lowest point 46 substantially midway between the side walls 12 and 14. The bottom surface 46 is preferably horizontal. The top and bottom surfaces of the end support 26 are adapted to engage grasping projections on the other end of the unitary handle referred to above, and to centrally position the handle end between the basket side walls 12 and 14.

To permit the transfer of wafers in bulk (more than one wafer at a time) from one wafer basket to another, an empty wafer basket may be inverted and placed in top-to-top engagement with another wafer basket which contains wafers. The pair of baskets may then be inverted, causing the wafers in the full basket to descend by gravity (or by force applied through the open bottom end) into the aligned grooves of the bottom basket. To provide for accurate alignment of baskets, the upper surfaces 50 of the side walls 12 and 14 of wafer baskets of the invention are provided with upwardly extending pins 52 and with pin-fitting depressions 54. The pins and depressions preferably are positioned adjacent the ends of the top surfaces of the walls 12 and 14. The depressions preferably are open from the ends of the walls as well as from the top surfaces thereof, and the upwardly facing inner surfaces 56 (FIGS. 1 and 4) of the depressions 54 are preferably tapered downwardly towards the ends of the walls, all for the purpose of permitting the depressions to be easily cleaned and to permit the pins of one basket to be easily engaged in the depressions of another basket. By locating the upwardly extending pins 52 on the upper surface of one side wall, and the depressions 54 in the upper surface of the other side wall, the identity of the end supports of adjacent basket ends may be preserved.

The wafer baskets of the invention preferably are made of temperature and chemical-resistant plastics such as the fluorinated polyolefins sold under the trade name "Teflon" by E. I. DuPont DeNemours and Company, Inc. (e.g., "Teflon PFA"), and preferably are made by injection molding techniques. The baskets of the invention may be made of teflon T.F.E. (polytetrafluoroethylene) by known sintering techniques. Wafer baskets of the invention which need not withstand high processing temperatures preferably are made of less expensive thermoplastic materials such as polypropylene. The surfaces of most plastics, particularly the Teflons and such polyolefins as polyethylene, polypropylene and the like are somewhat resilient, and the propensity of baskets made of such materials to damage silicon wafers contained therein is less than that of baskets made of aluminum or other metals.

Referring now to FIGS. 5–8, a unitary handle 60 having an arcuate center portion 62 and depending legs 64 and 66 terminating respectively in broadened, inwardly facing ends 68 and 70 is provided for attachment to the end supports 24 and 26, respectively, of the basket 10. About its outer periphery, the handle 60 has an outwardly extending, stiffening rib 72. End 68 of the handle has spaced, inwardly projecting horizontal projections 74 and 76 which respectively are adapted to loosely engage the top and bottom surfaces 36 and 32 of the end support 24. The horizontal projection 76 is provided centrally of its width with an upwardly and inwardly extending projection 78, the width of which is slightly less than the horizontal width of the corresponding upwardly and inwardly tapered section 34 of the bottom surface of the end support 24. The end 68 of the handle thus snaps on to the end support 24, projection 78 of the handle engaging tapered section 34 of the end member to centrally position the end of the handle with respect to the end support. The other end 70 of the handle 60 has an upwardly and inwardly extending horizontal projection 80 which is adapted to contact the bottom surface 46 of the other basket end support 26. Spaced upwardly from the projection 80, and positioned centrally of the width of the handle end 70, is inwardly extending pin projection 82 which is adapted to engage the lowest point 44 of the upper surface of end support 26 and thus center the handle end 70 on that basket end support. When snapped on to the end supports 24 and 26 of a wafer basket of the invention, the handle 60 describes an arch over the open end of the basket. Cooperation of the projections extending inwardly of the handle ends and the top and bottom surfaces of the end supports of the basket prevent the basket from tipping about axis 42 with respect to the handle. The handle 60 is preferably made of a plastic such as those exemplified above. The inwardly extending projections 76, 78 and 80 of the handle ends are sufficiently resilient as to be biased downwardly during mounting of the handle ends upon the end supports 24 and 26 of the wafer basket. The handle may thus be readily attached to the basket for transporting wafers from one processing stage to another or for supporting the basket during treatment of the wafers in a processing stage.

While I have described a preferred embodiment of my invention, it should be understood that various changes, adaptations, and modifications may be made therein without departing from the spirit of the invention and the scope of the appended claims.

What I claim is:

1. In a wafer basket having opposed side walls adapted to carry axially aligned wafers therebetween, an open top through which wafers may be inserted and ejected and free of obstructions interfering with insertion and ejection of wafers, an open bottom, and end supports joining the side walls at their respective ends, the improvement wherein one end support joins said side walls adjacent bottom edges thereof and has a horizontal bottom edge and a recessed, upwardly concave, U-shaped upper edge with the bottommost point of the U-midway between the side walls and below the axis of wafers in the basket to allow endwise access to wafers axially of the wafers, and the other end support comprises a horizontal bar joining said side walls substantially midway their heights.

2. The wafer basket of claim 1 wherein top surfaces of the side walls are provided with alignment means for top-to-top alignment of two of said wafer baskets, said alignment means permitting top-to-top alignment only when like end supports of the basket are aligned, whereby wafers may be transferred in bulk from one basket to the other while maintaining identity of end supports.

3. The wafer basket of claim 2 wherein said alignment means comprises pins arising from, and pin-receiving depressions in, said top surfaces, the pin-receiving depressions being formed in the top surface of one side wall, and the pins arising from the top surface of the other side wall.

4. The wafer basket of claim 1 including a handle having ends adapted to grasp the respective end supports, one end of the handle having a projection engaging said one end support with the upwardly concave surface solely at the midpoint thereof to center the latter handle end with respect to the basket.

5. The wafer basket of claim 4 wherein said other support has a horizontal top surface and an upwardly and inwardly tapered bottom surface section approximately equidistant from said side walls.

6. A wafer basket having opposed side walls adapted to carry axially aligned wafers therebetween, an open top for insertion and ejection of wafers, an open bottom, and end supports joining the side walls at their respective ends, one end support joining said sides solely adjacent bottom edges of the latter to allow end-wise access to wafers axially thereof, said one support having a substantially horizontal bottom surface and a recessed, upwardly concave top surface, the lowest point of said top surface being approximately midway between said side walls and below the axis of wafers in the basket, the other end support comprising a horizontal bar having a horizontal top surface and a bottom surface including an upwardly and inwardly tapered section thereof positioned centrally between said side walls, said other support being joined to the said side walls substantially midway their heights.

7. The wafer basket of claim 6 including a unitary, detachable carrying handle having an arcuate, flexible midsection and depending legs, one leg having a broadened end portion having inwardly extending lateral projections adapted to engage the horizontal top surface and bottom surface of said other end support of the basket, and the other leg having an inwardly extending lateral projection and an inwardly extending pin spaced thereabove to contact respectively the bottom surface and the center of the concave top surface of said one end member.

8. In combination, a wafer basket and handle therefor, said basket having opposed side walls adapted to carry axially aligned wafers therebetween, an open top for insertion and ejection of wafers, an open bottom, and end supports joining the side walls at their respective ends, one end support joining the side walls solely adjacent bottom edges thereof to allow end-wise access to wafers axially thereof and having a substantially horizontal bottom surface and a top surface upwardly concave, the lowest point of the top surface being approximately midway between the side walls, the other end support having a horizontal top surface and a bottom surface including an upwardly and inwardly tapered section thereof positioned centrally between the side walls, and being joined to the side walls substantially midway their heights, said handle having an arcuate, flexible midsection and depending legs adapted to grasp the respective end portions of the basket, one leg having an end portion having an inwardly extending lateral projection thereon and an inwardly extending pin spaced thereabove to contact respectively the bottom surface and the central portion of the concave top surface of the one end member, and the other leg having an end with an inwardly extending lateral projection adapted to contact the top surface of the other end support of the basket and an inwardly extending lateral projection adapted to contact the bottom surface of the other end support and having a centrally positioned, upwardly and inwardly extending section adapted to contact the upwardly and inwardly tapered section of the lower surface of the other end support.

9. In a water basket having opposed side walls adapted to carry axially aligned wafers therebetween, an open top through which wafers may be inserted and ejected, an open bottom, and end supports joining the side walls at their respective ends, the improvement wherein one end support joins said side walls solely adjacent bottom edges thereof to allow endwise access to wafers axially thereof, and the other end support joins said side walls substantially midway their heights, top surfaces of the side walls having alignment means for top-to-top alignment of two of said wafer baskets, the alignment means comprising pins arising from, and pin-receiving depressions in, said top surfaces.

10. A wafer basket having opposed side walls adapted to carry axially aligned wafers therebetween, an open top for insertion and ejection of wafers, an open bottom, and end supports joining the side walls at their respective ends, one end support joining said side solely adjacent bottom edges of the latter to allow endwise access to wafers axially thereof, said one end support having a substantially horizontal bottom surface and an upwardly concave top surface, the lowest point of the top surface being approximately midway between the side walls, the other end support having a horizontal top surface and a bottom surface including an upwardly and inwardly tapered section positioned centrally between the side walls, said other support being joined to the side walls substantially midway their heights, top surfaces of the side walls including alignment pins arising therefrom and alignment pin depressions therein, whereby two such wafer baskets may be aligned in top-to-top engagement to permit bulk transfer of wafers from one basket to the other.

* * * * *